US012713663B2

(12) United States Patent
Nourbakhsh et al.

(10) Patent No.: US 12,713,663 B2
(45) Date of Patent: Aug. 18, 2026

(54) SILICON SUPER JUNCTION STRUCTURES FOR INCREASED VOLTAGE

(71) Applicant: Applied Materials, Inc., Santa Clara, CA (US)

(72) Inventors: Amirhasan Nourbakhsh, Albany, NY (US); Raman Gaire, Mechanicville, NY (US); Pei Liu, Rexford, NY (US); Tyler Sherwood, Fonda, NY (US); Ryan Scott Smith, Clifton Park, NY (US); Roger Quon, Rhinebeck, NY (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 790 days.

(21) Appl. No.: 18/171,090

(22) Filed: Feb. 17, 2023

(65) Prior Publication Data

US 2024/0282809 A1 Aug. 22, 2024

(51) Int. Cl.
*H10D 62/10* (2025.01)
*H10D 30/01* (2025.01)
*H10D 62/17* (2025.01)

(52) U.S. Cl.
CPC ......... *H10D 62/106* (2025.01); *H10D 30/021* (2025.01); *H10D 62/127* (2025.01); *H10D 62/393* (2025.01)

(58) Field of Classification Search
CPC .. H10D 62/106; H10D 30/021; H10D 62/127; H10D 62/393

(Continued)

(56) References Cited

U.S. PATENT DOCUMENTS

2002/0185705 A1* 12/2002 Saitoh .................. H10D 30/665 257/E29.066
2005/0184336 A1* 8/2005 Takahashi ............ H10D 30/665 257/E21.418

(Continued)

FOREIGN PATENT DOCUMENTS

CN 104638004 A 5/2015
CN 106847919 A1 6/2017

OTHER PUBLICATIONS

International Search Report and Written Opinion for PCT/US2024/016038 mailed Jun. 12, 2024, 11 pages.

*Primary Examiner* — Igwe U Anya
(74) *Attorney, Agent, or Firm* — Kilpatrick Townsend & Stockton LLP

(57) ABSTRACT

A super junction device with an increased voltage rating may be formed by decreasing the width of the P-type region and increasing the doping concentration, while also increasing the height of the overall device. However, instead of etching a trench in the N-type material to fill with the P-type material, a trench may be etched for both the P-type region and an adjacent N-type region. This allows the height of the overall device to be increased while maintaining a feasible aspect ratio for the trench. The P-type material may then be formed as a sidewall liner on the trench that is relatively thin compared to the remaining width of the trench. The trench may then be filled with N-type material such that the P-type region fills the space between the N-type regions without any voids or seams, while having a width that would be unattainable using traditional etch-and-fill methods for the P-type region alone.

20 Claims, 11 Drawing Sheets

(58) Field of Classification Search
USPC .......................................................... 257/339
See application file for complete search history.

(56) References Cited

U.S. PATENT DOCUMENTS

| | | | | |
|---|---|---|---|---|
| 2008/0272429 | A1* | 11/2008 | Ishiguro | H10D 30/66 257/E21.345 |
| 2013/0299896 | A1* | 11/2013 | Yao | H10D 62/111 257/329 |
| 2014/0110779 | A1* | 4/2014 | Tamaki | H10D 12/031 257/329 |
| 2016/0225847 | A1 | 8/2016 | Sakata et al. | |
| 2019/0221664 | A1 | 7/2019 | Arai et al. | |
| 2020/0076290 | A1 | 3/2020 | Arai et al. | |
| 2023/0064236 | A1* | 3/2023 | Anderson | H10D 12/031 |

* cited by examiner

SILICON SUPER JUNCTION STRUCTURES FOR INCREASED VOLTAGE

TECHNICAL FIELD

The present technology relates to semiconductor systems, processes, and equipment. More specifically, the present technology relates to processes and systems to improve scaling for high aspect ratio power devices.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in recessed features in the materials that may have uneven, or tapered, sidewalls due to increased exposure during processing. Developing materials with straight sidewalls may become more difficult. Further, backfilling recessed features with material without any seams and/or voids may also become more difficult.

Thus, there is a need for improved systems and methods that can be used to produce high quality devices and structures. These and other needs are addressed by the present technology.

SUMMARY

In some embodiments, a super junction device may include a first N-type region extending orthogonally up from a substrate. The substrate may form a first contact region for the device. The device may also include a second N-type region extending orthogonally up from the substrate to a second contact region of the device, and a P-type region extending orthogonally up from the substrate to a third contact region of the device. The P-type region may be disposed between the first N-type region and the second N-type region. A width of the P-type region may make up less than or about 10% of a combined width of the P-type region and the second N-type region.

In some embodiments, a super junction device may include a silicon substrate forming a drain region for the device, a gate region, a source region, an N-type region extending from the silicon substrate up to the gate region, and a P-type region extending from the silicon substrate up to the source region. The device has a breakdown voltage of greater than or about 1000 V.

In some embodiments, a method of forming a super junction device may include forming an first N-type material on a substrate. The N-type region may have a height of greater than or about 70 μm above the substrate. The method may also include etching a trench in the first N-type material. The trench may extend from a top surface of the first N-type material down to at least a top surface of the substrate to form a first N-type region. The method may additionally include forming a P-type liner on a sidewall portion of the first N-type region in the trench. The method may further include filling the trench with an N-type material to form a second N-type region such that the P-type liner is between the first N-type region and the second N-type region.

In any embodiments, any and all of the following features may be implemented in any combination and without limitation. A height of the P-type region may be greater than or about 70 μm. The width of the P-type region may be less than or about 200 nm. The first contact region may include a drain of a super junction transistor, the second contact region may include a gate of the super junction transistor, and the third contact region may include a source of the super junction transistor. The super junction transistor may have a breakdown voltage of greater than or about 1200 V. The combined width of the P-type region and the second N-type region may be less than or about 4 μm. A doping concentration of the P-type region may be higher than a doping concentration of the second N-type region. A height of the N-type region may be about 80 μm. An aspect ratio of an area occupied by the N-type region and the P-type region may be less than or about 20. A width of the area occupied by the N-type region and the P-type region may be less than or about 4 μm. The trench may be etched below the top surface of the substrate. The method may also include forming a passivation layer over the P-type liner. The method may additionally include removing the passivation layer before filling the trench. The P-type liner is also formed on a bottom of the trench. The method may also include performing a directional etch to remove the P-type liner from the bottom of the trench while leaving the P-type liner along the sidewall portion of the trench. The P-type liner may be less than or about 300 nm. A doping concentration of the N-type region may be between about 1e14 dopants/$cm^3$ and about 1e16 dopants/$cm^3$. A doping concentration of the P-type region may be greater than about 8 times the doping concentration of the N-type region.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
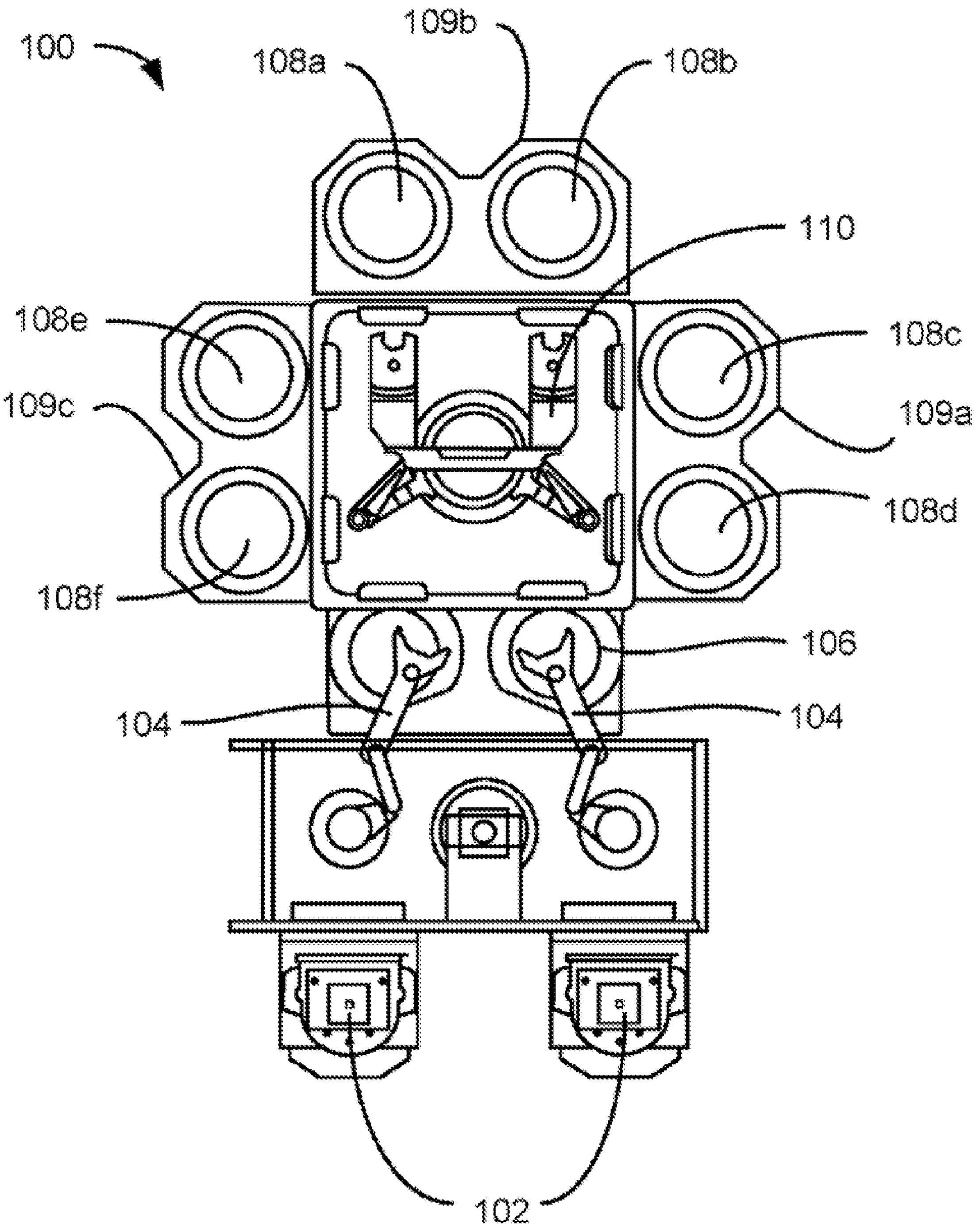
FIG. 1 shows a top plan view of one embodiment of a processing system of deposition, etching, baking, and curing chambers that may be included or configured according to some embodiments of the present technology.

A super junction device with an increased voltage rating may be formed by decreasing the width of the P-type region and increasing the doping concentration, while also increasing the height of the overall device. However, instead of etching a trench in the N-type material to fill with the P-type material, a trench may be etched for both the P-type region and an adjacent N-type region. This allows the height of the overall device to be increased while maintaining a feasible aspect ratio for the trench. The P-type material may then be formed as a sidewall liner on the trench that is relatively thin compared to the remaining width of the trench. The trench may then be filled with N-type material such that the P-type region fills the space between the N-type regions without any voids or seams, while having a width that would be unattainable using traditional etch-and-fill methods for the P-type region alone.

As device sizes continue to shrink, many material layers may be reduced in thickness and size to scale devices. Features inside semiconductor structures may be reduced in size, and aspect ratios of the features may increase. As the aspect ratios of the features increase, patterning operations may struggle to uniformly etch features without tapering the sidewalls of the feature, or compromising feature dimensions or integrity, due to increased exposure nearer a surface of the substrate material being processed. Further, refilling a feature with higher aspect ratios may be increasingly difficult due to pinch off at the top of the feature that prevents the feature from being filled without seams and/or voids.

In forming power device structures, conventional technologies have been limited in device scaling for increased aspect ratio features based on the natural effects of prolonged etching and deposition operations. For example, in super junction structures, p-type silicon pillars are formed by filling trenches etched into n-type silicon with p-type material. In these structures, the on-resistance is controlled by the pitch or width of the different materials. The resistance may be improved by reducing the width of the p-type silicon pillars. Scaling the p-type silicon pillars is limited by etching and seam and/or void free trench filling capabilities. For example, increasing the aspect ratio with conventional etching may cause pitch degradation and tapered features due to the prolonged exposure of upper regions of the feature being formed. Additionally, the fill operation of high-aspect ratio features may lead to pinch off before deeper regions of the feature are filled. Consequently, conventional technologies have been limited to lower aspect ratios, or shorter structures to limit performance effects or device failure. Accordingly, many conventional technologies have been limited in the ability to prevent structural flaws in the final devices or improve on historical designs.

The present technology overcomes these issues by redefining the way in which the pillars are formed in the base material. By forming a thin epitaxial liner within a wider overall feature prior to backfill, the pillars of material can be maintained at much smaller widths compared to conventional technologies. More specifically, the width of the pillars of material may be defined by the width of the epitaxial liner rather than the width of the recessed features. In fact, the recessed features can be made wider than conventional technologies as two pillars may be deposited on sidewalls of each recessed feature. After forming materials on the sidewalls, the recessed features may be backfilled with additional base material. By changing the formation process itself, the present technology may afford much greater aspect ratio features, and also may prevent or reduce defects in final devices based on more uniform fill and coverage.

Although the remaining disclosure will routinely identify specific etching and deposition processes utilizing the disclosed technology, it will be readily understood that the systems and methods are equally applicable to a variety of other processes as may occur in the described chambers.

Accordingly, the technology should not be considered to be so limited as for use with the described etching or deposition processes alone. The disclosure will discuss one possible system that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 100 of deposition, etching, baking, and curing chambers that may be included or configured according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108*a-f* may include one or more system components for depositing, annealing, curing and/or etching a material film on the substrate or wafer. In one configuration, two pairs of the processing chambers, for example 108*c-d* and 108*e-f*, may be used to deposit material on the substrate, and the third pair of processing chambers, for example 108*a-b*, may be used to cure, anneal, or treat the deposited films. In another configuration, all three pairs of chambers, for example 108*a-f*, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
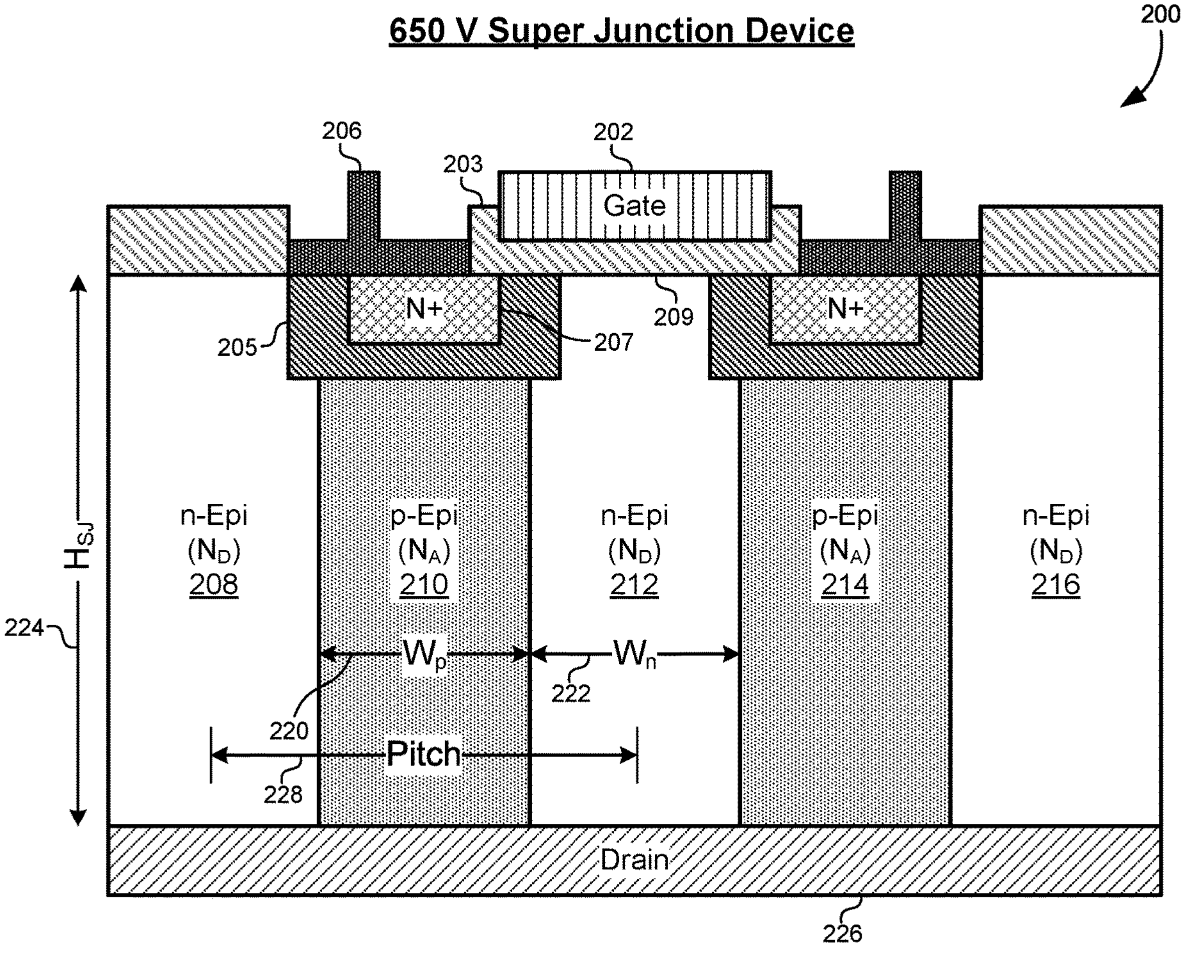
FIG. 2 illustrates a super junction device, according to some embodiments.

System 100, or more specifically chambers incorporated into system 100 or other processing systems, may be used to produce structures according to some embodiments of the present technology. FIG. 2 illustrates a super junction device 200, according to some embodiments. The device 200 in FIG. 2 is represented by example as a super junction transistor, such as a super junction MOSFET. However, the principles described herein may be used to form any super junction device, and the description is not limited to a super junction transistor.

The device 200 may include a number of different electrical contacts. The device 200 may include a source contact 206 that is electrically coupled to an N+ source region 207 that is formed within a P-well 205. Collectively, the source contact 206, the N+ source region 207, and the P-well 205 may be referred to as a "source region" of the device 200. The device may be formed on a silicon substrate 226. The silicon substrate 226 may form a drain region of the device 200. Although not shown explicitly in FIG. 2, the drain region formed by the substrate 226 may include a conductive contact similar to the source contact 206. The device 200 may also include a gate region that includes a gate contact 202 and a gate oxide 209. Each of the source, drain, and gate regions may include other layers or regions that are not explicitly shown in FIG. 2. Additionally, these contacts may also be referred to in this disclosure more generically as a "first," "second," and "third" contact to distinguish one contact from the other in a manner that is not specific to a transistor. For example, in this transistor implementation, the drain region may be referred to as a first contact region, the gate region may be referred to as a second contact region, and the source region may be referred to as a third contact region.

The internal regions of the device 200 may include a plurality of N-doped regions and/or P-doped regions. These regions may also be referred to as "pillars," as these regions typically extend from the silicon substrate 226 up to the top of the device 200. The device 200 may include a first N-type region 208 that extends orthogonally up from the silicon substrate 226 to the top of the device 200. The device 200 may also include a P-type region 210 that also extends orthogonally up from the silicon substrate 226 to the source region of the device 200. The device 200 may also include a second N-type region 212 that similarly extends orthogonally up from the silicon substrate 226 to the gate region. Note that the device 200 may also include additional contact regions, P-type regions (e.g., P-type region 214), and N-type regions (e.g., N-type region 216), some of which are illustrated in FIG. 2.

Typically, the width 220 of the P-type region 210 and the width 222 of the second N-type region 212 are approximately the same in standard super junction devices. Additionally, a doping level ($N_A$) of the P-type region 210 and a doping level ($N_D$) of the N-type region 212 are also equal. In order to function optimally, the charge should be balance between the second N-type region 212 and the P-type region 210 according to the following equation.

$$N_A W_p = N_D W_n \tag{1}$$

With careful charge balancing between the N-type pillars in the P-type pillars in the device 200, these regions may completely deplete each other to form a depletion region throughout the bulk of the device 200. Full depletion increases the breakdown voltage of the device 200 significantly without lowering the doping concentrations. This allows the device to have very high doping concentrations in the N-type regions so long as the balance is maintained according to equation (1) above.

The breakdown voltage of the device 200 is also a function of the height 224 of the device 200. Typically, the greater the height 224 of the device 200, the higher the breakdown voltage of the device 200. However, manufacturing limitations have limited the height 224 of the device 200 due to aspect ratios of the features. Specifically, forming the device typically includes forming an N-type material on top of the silicon substrate 226. Trenches are then etched in the N-type region, leaving N-type mesas that include, for example, N-type region 208, N-type region 212, and so forth. The trenches are then filled with the P-type material to form the P-type regions, such as P-type region 210, P-type region 214, and so forth. Therefore, the aspect ratio of the trench limits the depth of the trench unless the width of the trench is increased. However, increasing the width of the trench increases the total size of the device 200. With shrinking device sizes, increasing the size of the device to increase the breakdown voltage is not a feasible option in most applications.

For example, the device 200 in FIG. 2 may be rated as a 650 V device. The specifications for this 650 V device include a height 224 of about 40 μm. The width 220 of the P-type region 210 is about 2 μm (also referred to as a critical dimension or "CD"). This leads to an aspect ratio of 40/2=20 for a trench that is etched to form the P-type region 210. The pitch 228 is about 4 μm, which may be defined as the distance between centers of consecutive N-type regions. The aspect ratio of 20 has been found to be an acceptable feature size for current etch and fill operations for devices of this size. Increasing the aspect ratio beyond 20 at this size can cause problems when etching the trenches. Specifically, the trenches may erode at the top surface of the trench, and may develop sloped sidewalls with a poorly defined bottom in the trench. Increasing the aspect ratio may also cause problems when filling the trenches. When depositing material in the trenches, the material may close off the trench at the top before the trench is filled throughout the height of the trench. This may cause voids or seams in the P-type regions that interfere with the operation of the device 200.

Figure 3:
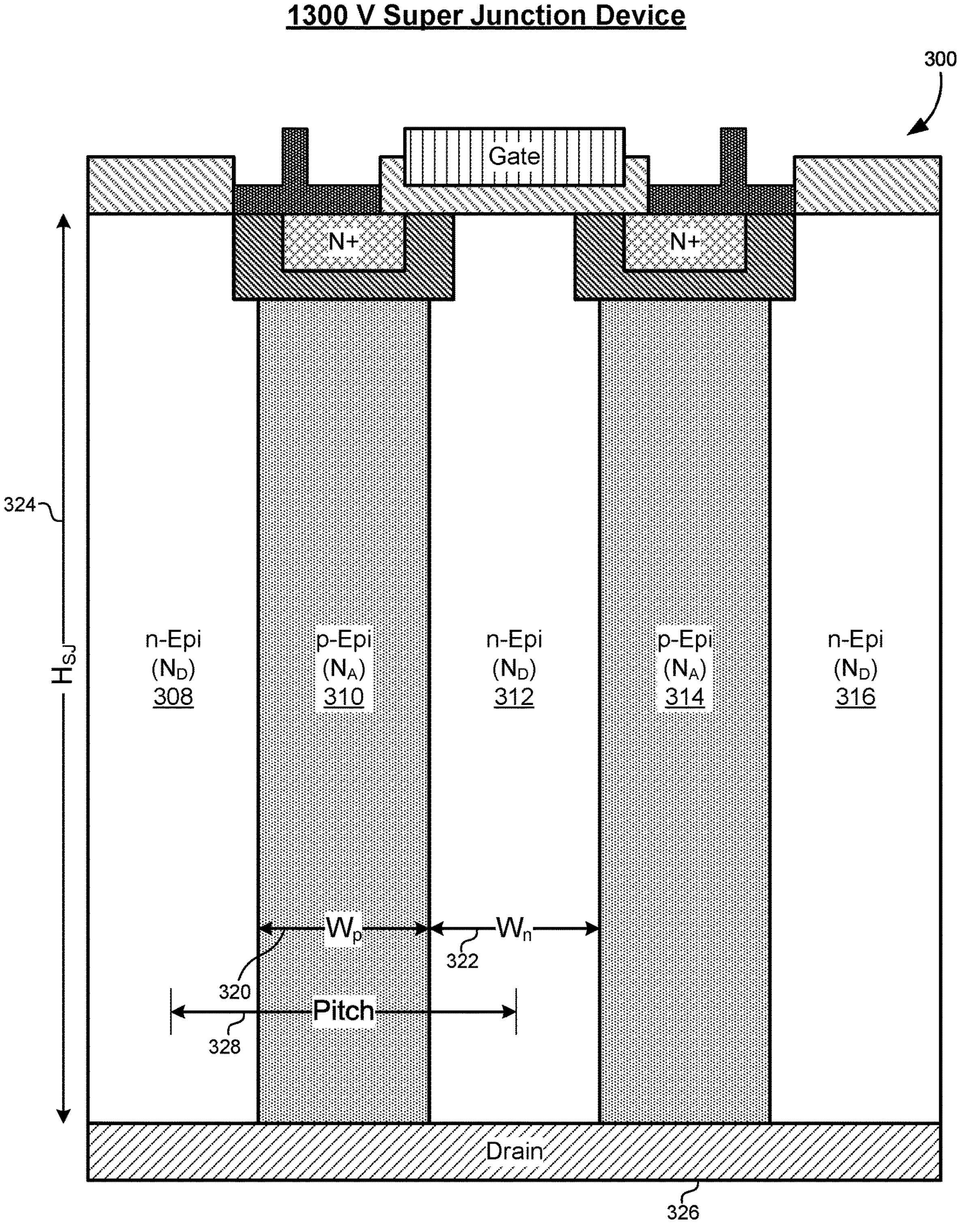
FIG. 3 illustrates an example of a 1300 V super junction device, according to some embodiments.

FIG. 3 illustrates an example of a 1300 V super junction device 300, according to some embodiments. Similar to the 650 V device in FIG. 2, this device 300 may include source, gate, and drain regions and a silicon substrate 326. The center portion of the device may include alternating pillars, such as a first N-type region 308, a P-type region 310, a second N-type region 312, an additional P-type region 314 and an additional N-type region 316, and so forth.

This 1300 V super junction device 300 provides roughly double the breakdown voltage of the 650 V device in FIG. 2. In order to double the voltage, the height 324 of the device 300 has been doubled. However, doubling the height 324 of the device 300 will also double the aspect ratio of the trenches needed to form the P-type region 310. For example, when the height 324 of the device 300 is doubled to be about 80 μm, and the width 320 of the P-type region 310 is maintained at 2 μm, the aspect ratio doubles to be about 40. Etching a trench with an aspect this height tends not to generate a well-defined trench, and is difficult or impossible to fill without seams or voids. Therefore, the only option for maintaining a higher voltage for the device 300 is to increase the width or critical dimension of the trench accordingly. For example, to maintain an aspect ratio of 20, the width of the trench needs to double to 4 μm. This creates a pitch of 328 that is also double the pitch 228 of the 650 V device 200. This leads to a device 300 that is double the width overall of the 650 V device 200. Doubling the size of a device is rarely a feasible option in most applications.

The embodiments described herein solve this problem of creating a high-voltage device by using a liner to create the P-type regions instead of etching and filling the trench. For example, these techniques may be used to form a device with a breakdown voltage greater than or about 1000 volts, such as a 1300 V device. In one embodiment, the height of the device may be doubled to about 80 μm, and a trench with a width or critical dimension of 4 μm may be etched. This results in a trench having an aspect ratio of 20 as described above for the 650 V device 200. However, contrary to the device 200 illustrated in FIG. 2, the trench may be lined with a P-type material, then filled with an N-type material. This creates a very narrow P-type region (e.g., between 50 nm and 300 nm), and the resulting pitch between the N-type regions will still be 4 μm. This creates a 1300 V device with the same overall width as the 650 V device described above.

Figure 4:
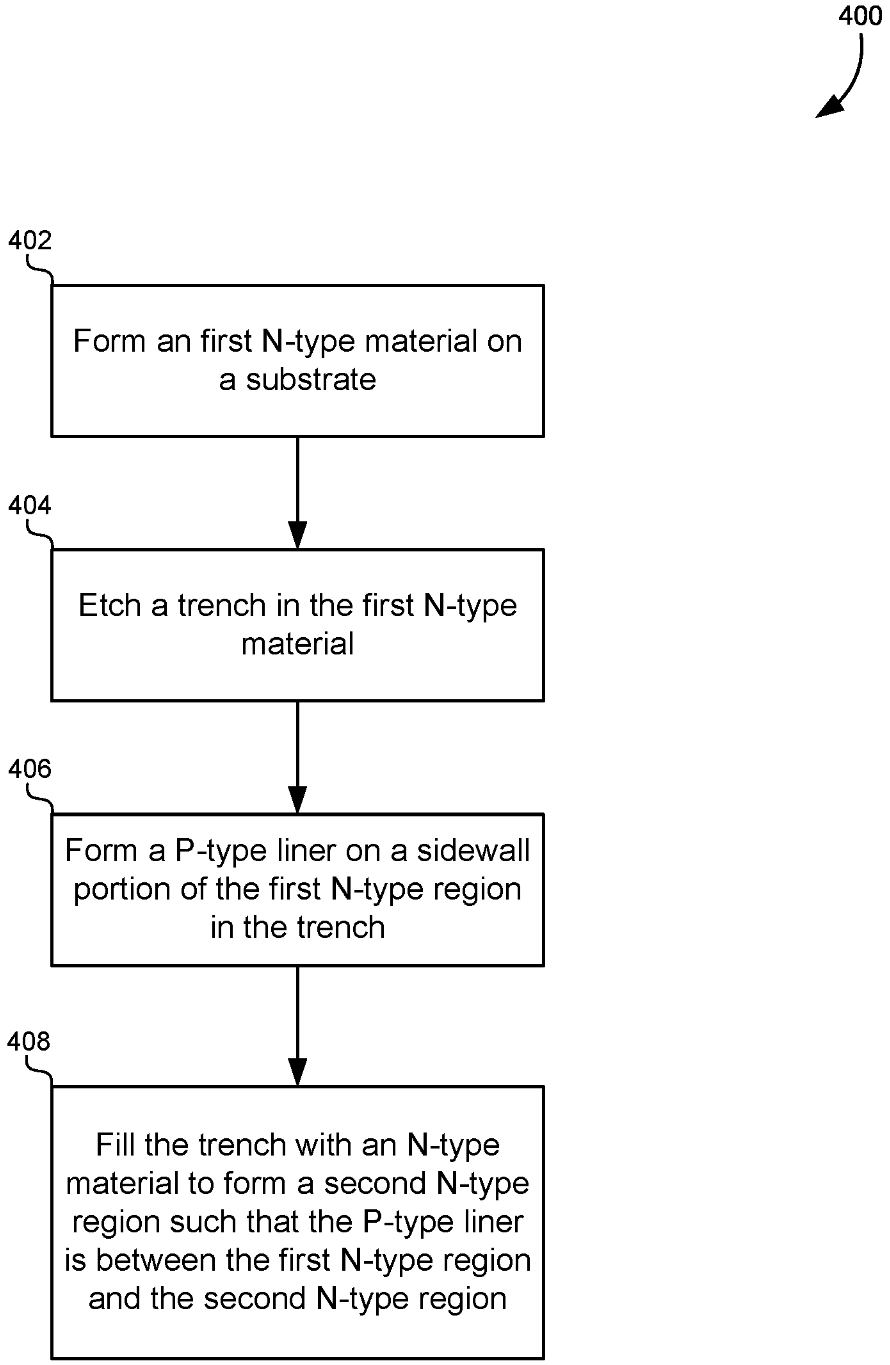
FIG. 4 illustrates a flowchart of a method of forming a super junction device with a high breakdown voltage, according to some embodiments.

FIG. 4 illustrates a flowchart 400 of a method of forming a super junction device with a high breakdown voltage, according to some embodiments. The method of flowchart 400 may be performed in one or more processing chambers, such as chambers incorporated in the system 100 described above. The method of flowchart 400 may or may not include one or more operations prior to the initiation of the method, including front-end processing, deposition, etching, polishing, cleaning, or any other operations that may be performed prior to the described operations. The method may also include a number of optional operations as denoted in the figure, which may or may not be specifically associated with some embodiments of methods according to the present technology.

FIGS. 5A-5G illustrate incremental structures for forming the super junction device with a high breakdown voltage, according to some embodiments. The method of flowchart 400 describes operations shown schematically in FIGS. 5A-5G, the illustrations of which will be described in conjunction with the operations of this method. It is to be understood that the figures illustrate only partial schematic views with limited details, and in some embodiments a substrate may contain any number of semiconductor sections having aspects as illustrated in the figures, as well as alternative structural aspects that may still benefit from any of the aspects of the present technology.

Figure 5A:
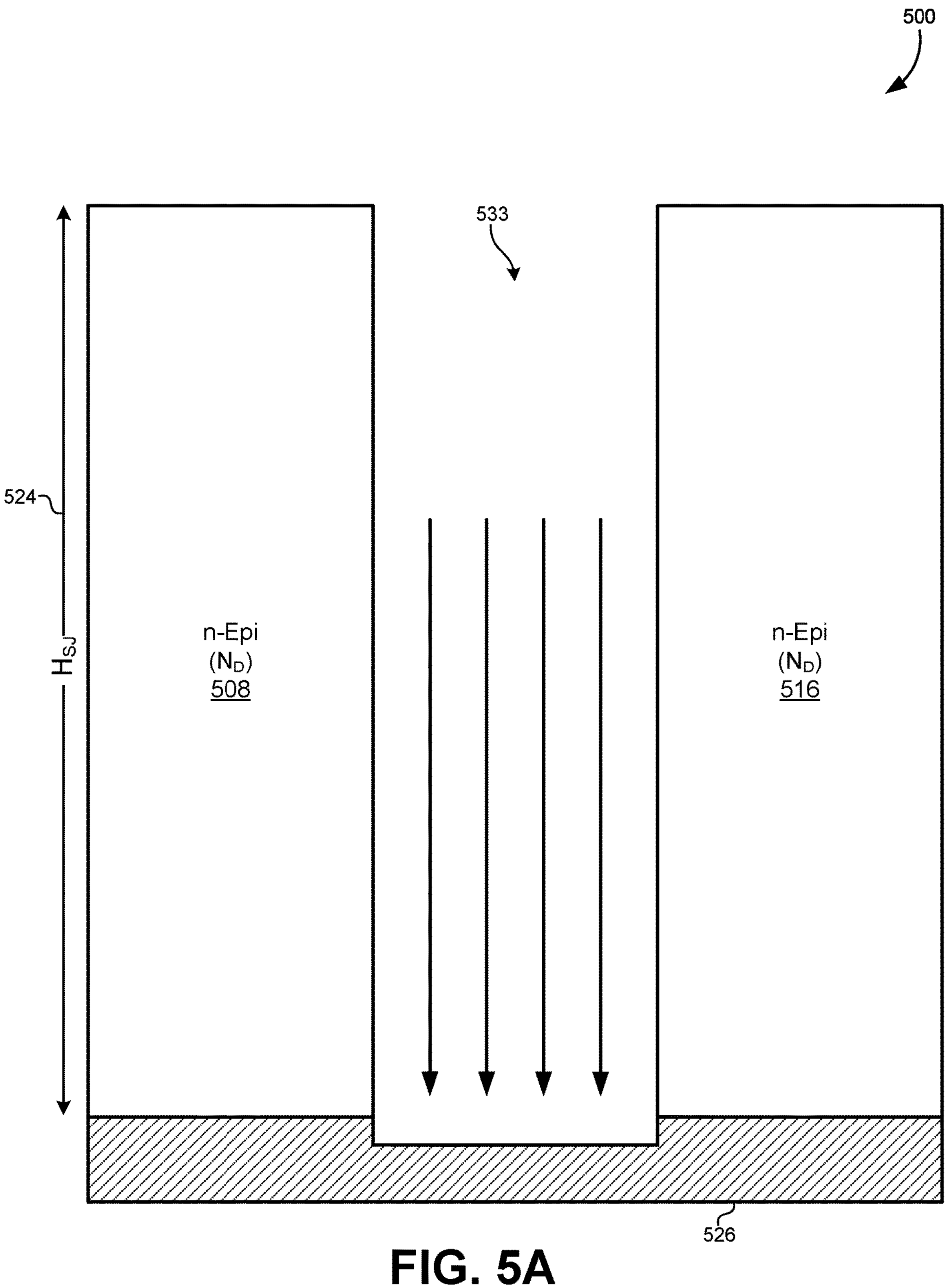
FIGS. 5A-5G illustrate incremental structures for forming the super junction device with a high breakdown voltage, according to some embodiments.

The method of flowchart 400 may include forming a first N-type region over a substrate (402). As illustrated in FIG. 5A, the structure 500 may include a substrate 526. The substrate 526 may have a substantially planar surface or an uneven surface in various embodiments. The substrate 526 may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. As one non-limiting example, in some embodiments the substrate may be or include an N+ material, such as N+ silicon. The substrate 526 may have various dimensions, such as 200 mm or 300 mm diameter wafers, as well as rectangular or square panels. The substrate 526 may be disposed within the processing region of the semiconductor processing chamber. Although shown as a planar substrate, it is to be understood that substrate 526 is included merely to represent an underlying structure, which may include any number of layers or features on a wafer or other substrate, and over which structures as described below may be formed.

Above the substrate 526, the structure 500 may include a first N-type material. The first N-type material may be disposed along at least a portion or all of the substrate 526. The first N-type silicon-containing material may be N-type silicon, and which may be doped with phosphorous, arsenic, a combination of both, or other similar materials. The first N-type material may form the first N-type region 508, although the mesa or pillar of the first N-type region 508 (and possibly other N-type regions 516) may not become apparent until after a trench is etched in the following operation. The height of the first N-type material and the subsequent first N-type region 508 may be greater than or about 40 μm, between about 40 μm and about 50 μm, between about 50 μm and about 60 μm, between about 60 μm and about 70 μm, between about 70 μm and about 80 μm, greater than or about 80 μm, and so forth. For example, a device having a 1300 V breakdown voltage may have a first N-type region 508 that is about 80 μm high. For devices having a breakdown voltage greater than 650 V, the height of the first N-type region 508 may be greater than or about 50 μm, greater than or about 60 μm, greater than or about 70 μm, and/or greater than or about 80 μm. Other embodiments may include a first N-type region 508 that is less than about 40 μm, which may be used to form super junction devices with a smaller overall width. Other embodiments may also include a first N-type region that is greater than or about 90 μm, greater than or about 100 μm, and so forth, depending on the desired voltage characteristics of the super junction device.

In some embodiments, to facilitate patterning of the first N-type material, hard masks, photoresists, or any other mask materials may be disposed along the first N-type material. For example a first mask may be formed over the first N-type material, and a second mask may be formed over the first mask. In some embodiments, either or both masks may be any number of materials to promote structural formation, such as oxides, nitrides, carbides, or some combination of materials. For example, the first mask may be or include silicon nitride, and the second mask may be or include silicon oxide, or some other mask material. It is contemplated that a singular mask may be provided over the first N-type material and the embodiment depicted in FIG. 5A is merely one example structure 500.

The method of flowchart 400 may also include etching a trench 533 in the first N-type material (404). As shown in FIG. 5A, a pattern may be etched or formed through the first mask and/or the second mask to form features, such as the trench 533. The trench 533 may be etched through the first mask and/or the second mask using any etching processes and any etching reagents. In some embodiments, the etching may completely remove the second mask as a pattern is transferred into the underlying N-type material.

The etching of the first N-type material may form one or more trenches in the material. The trench 533 may be formed to a depth of greater than or about 10 μm, and may be formed to a depth of greater than or about 15 μm, greater than or about 20 μm, greater than or about 25 μm, greater than or about 30 μm, greater than or about 35 μm, greater than or about 40 μm, greater than or about 45 μm, greater than or about 50 μm, greater than or about 55 μm, greater than or about 60 μm, greater than or about 65 μm, greater than or about 70 μm, greater than or about 75 μm, greater than or about 80 μm, greater than or about 85 μm, greater than or about 90 μm, greater than or about 95 μm, greater than or about 100 μm, or greater. As illustrated in FIG. 5A, the trench 533 may extend all the way down to a top surface of the substrate 526. In some embodiments, the trench 533 may extend below a top surface of the substrate 526 such that the trench 533 penetrates the substrate 526. As described below, this provides a surface from which epitaxial silicon may be grown from the substrate 526 when filling the trench 533. Therefore, the height of the trench 533 correspond to any of the heights described above for the first N-type region 508 or higher. For example, the trench 533 may be about 80 μm high or slightly higher when extending into the substrate 526 for a 1300 V device.

Note that decreasing the height 524 of the trench 533 may also be reduced to reduce the breakdown voltage proportionally, since the breakdown voltage is directly related to the height of the device. For example, the height may be reduced heights below 80 μm corresponding to a breakdown voltage of greater than or about 1200 V, greater than or about 1100 V, greater than or about 1000 V, greater than or about 900 V, greater than or about 800 V, greater than or about 700 V, or greater than or about 650 V.

The trench 533 may have an aspect ratio, or a depth-to-width ratio less than or about 50, less than or about 40, less than or about 30, less than or about 25, less than or about 20, less than or about 15, less than or about 10, or less. Additionally the trench 533 may be formed to a width of greater than or about 1.5 μm, greater than or about 2.0 μm, greater than or about 2.5 μm, greater than or about 3.0 μm, greater than or about 3.5 μm, greater than or about 4.0 μm, greater than or about 4.5 μm, greater than or about 5.0 μm, greater than or about 6.0 μm, greater than or about 7.0 μm, greater than or about 8.0 μm, greater than or about 9.0 μm, greater than or about 10.0 μm, or greater. The trench 533 may also be formed to a width of between about 1.5 μm in about 2.0 μm, between about 2.0 μm and about 2.5 μm, between about 2.5 μm in about 3.0 μm, between about 3.0 μm and about 3.5 μm, between about 3.5 μm and about 4.0 μm, between about 4.0 μm and about 4.5 μm, between about 4.5 μm, and about 5.0 μm, between about 4.5 μm and about 6.0 μm, and so forth.

While conventional methods may strive for etching higher aspect ratio trenches to allow for narrower and deeper P-type regions to be deposited, forming trenches with higher aspect ratios may make structural formation more difficult. Not only may it be difficult to etch high aspect ratio trenches with consistent diameters, but it may also be difficult to backfill these trenches uniformly with the P-type material. Instead, the P-type material may have seams and/or voids present due to pinch off at the top of the feature during fill. Conversely, the embodiments described herein may counterintuitively allow for relaxing the width of the trench 533 to produce smaller pitch structures or higher aspect ratio structures, which may allow for more uniform etching and subsequent backfill. Further, with an increased width of the trench 533, deeper etching of the N-type material may be afforded. As an additional benefit of deeper etching, and therefore deeper structures of material, increased breakdown voltages for power devices produced by the present technology may be afforded compared to conventional methods and technology. For example, the 650 V device 200 illustrated in FIG. 2 may have trenches etched at approximately 2 μm wide, 40 μm deep, with an aspect ratio of 20. By relaxing the width of the trench 200, a 1300 V device may have trenches etched at approximately 4 μm wide, 80 μm deep, still with an aspect ratio of 20. As described below, the pitch of the N-type and P-type pillars may be maintained at approximately 4 μm, such that the overall width of the 1300 V device is about the same as the width of the 650 full device 200.

Figure 5B:
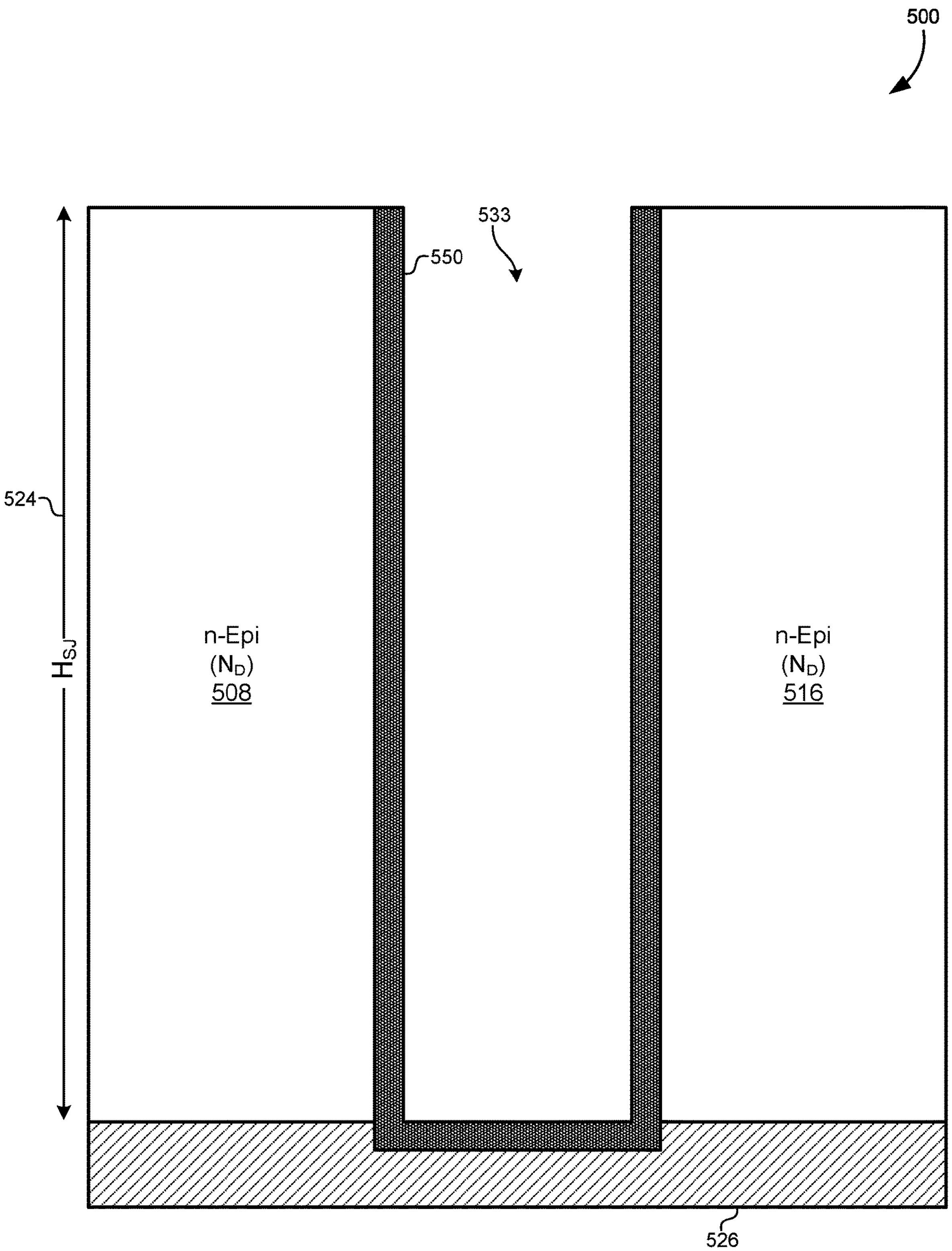

The method of flowchart 400 may include forming a P-type liner 550 on a sidewall portion of the first N-type region 508 in the trench 533 (406). FIG. 5B illustrates forming a P-type liner 550 on a sidewall portion of the first N-type region 508 in the trench 533, according to some embodiments. The deposition or formation may be performed in any number of ways, and in some embodiments the material may be formed conformally about the feature. The P-type liner 500, which may be p-type silicon, for example, may be deposited by atomic layer deposition, grown epitaxially, or produced by any number of other processes to produce conformal coverage about the trench 533. By having trenches characterized by wider width, the coverage may be uniform despite the greater depth of the trench 533. The P-type liner 550 may be characterized by a thickness of between about 50 nm and about 100 nm, between about 100 nm and about 150 nm, between about 150 nm and about 200 nm, between about 200 nm and about 250 nm, between about 250 nm and about 300 nm, greater than or about 300 nm, and so forth. The P-type liner 550 may also be characterized by a thickness of less than or about 200 nm, less than or about 150 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, less than or about 5 nm, or less. The P-type liner 550 may be a silicon-containing material doped with boron or other similar materials. In some embodiments, the P-type liner 550 may also include germanium.

The P-type liner 550 may substantially cover the sidewall portion of the first N-type region 508 in the trench 533. In some embodiments, the P-type liner 550 may also be formed on the bottom of the trench 533. The P-type liner 550 may be free of seams and/or voids based on the conformal coverage about the structure, even to a depth of several hundred nanometers, which may provide large improvements on performance for final devices compared to conventional technologies that have reduced or incomplete coverage at greater depths, as well as seam or void formation. However, it is contemplated that some pores may be present in the P-type liner 550, depending on the formation and thickness.

Figure 5C:
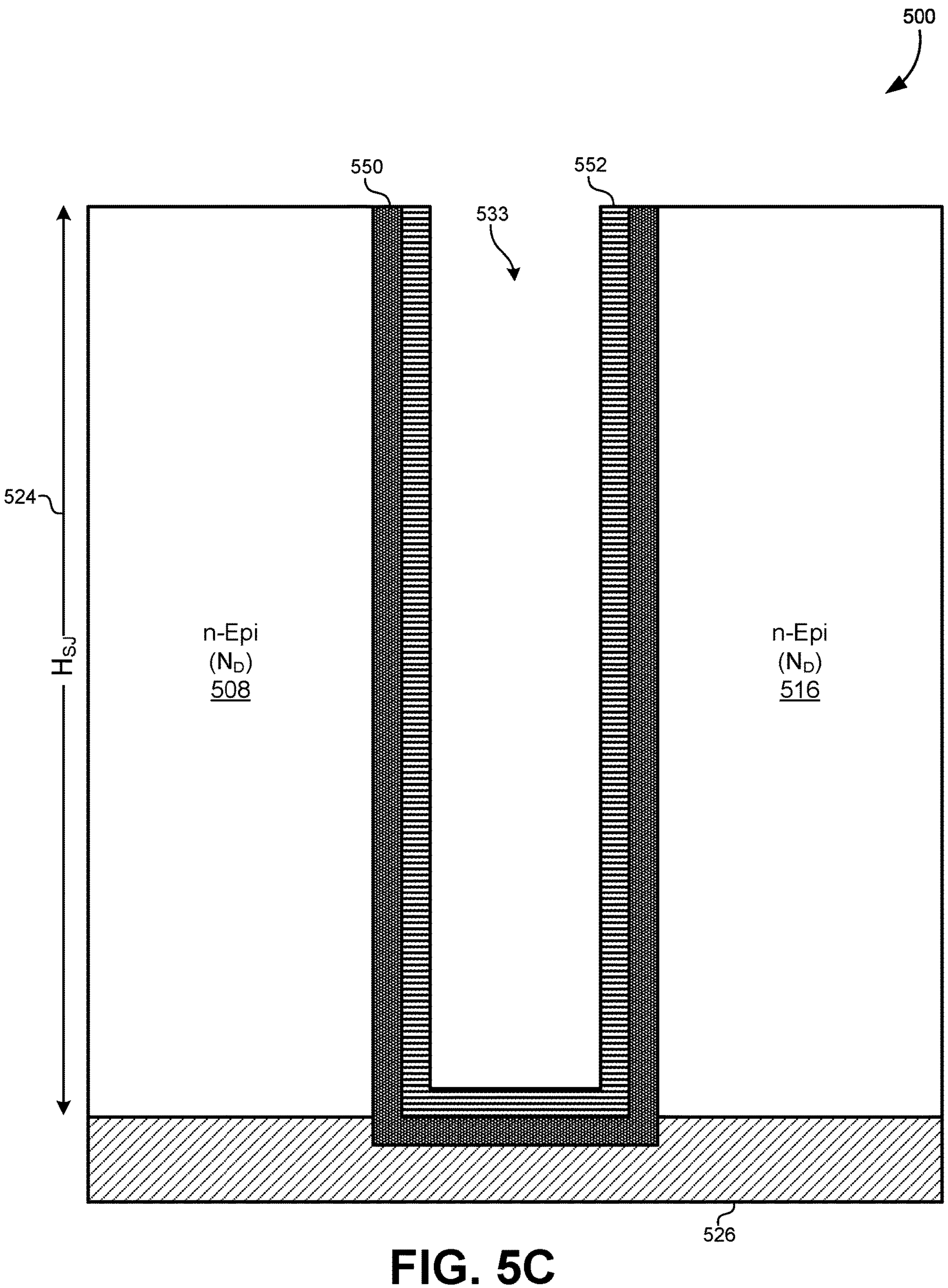

FIG. 5C illustrates the formation of a passivation layer 552 as part of an optional operation that may be added to the method of flowchart 400 in some embodiments. The passivation layer 552 may be formed by providing an oxygen-containing precursor to the processing region. The oxygen-containing precursor may be any number of precursors that may oxidize the P-type liner 550. As non-limiting examples, the oxygen-containing precursor may be or include diatomic oxygen, ozone, nitrous oxide, nitric oxide, sulfur dioxide or any other oxygen-containing precursors which may be delivered with or without plasma enhancement, and may be used to oxidize a depth of the existing material, or may be delivered with any other precursor, such as a silicon-containing precursor to deposit an oxide layer. The passivation layer 552 may be formed by using any deposition or growth method. The oxygen-containing material in the passivation layer 552 may oxidize and passivate at least a portion of the P-type liner 550. The passivation layer 335 may serve to protect the P-type liner 550 during subsequent etch operations.

Figure 5D:
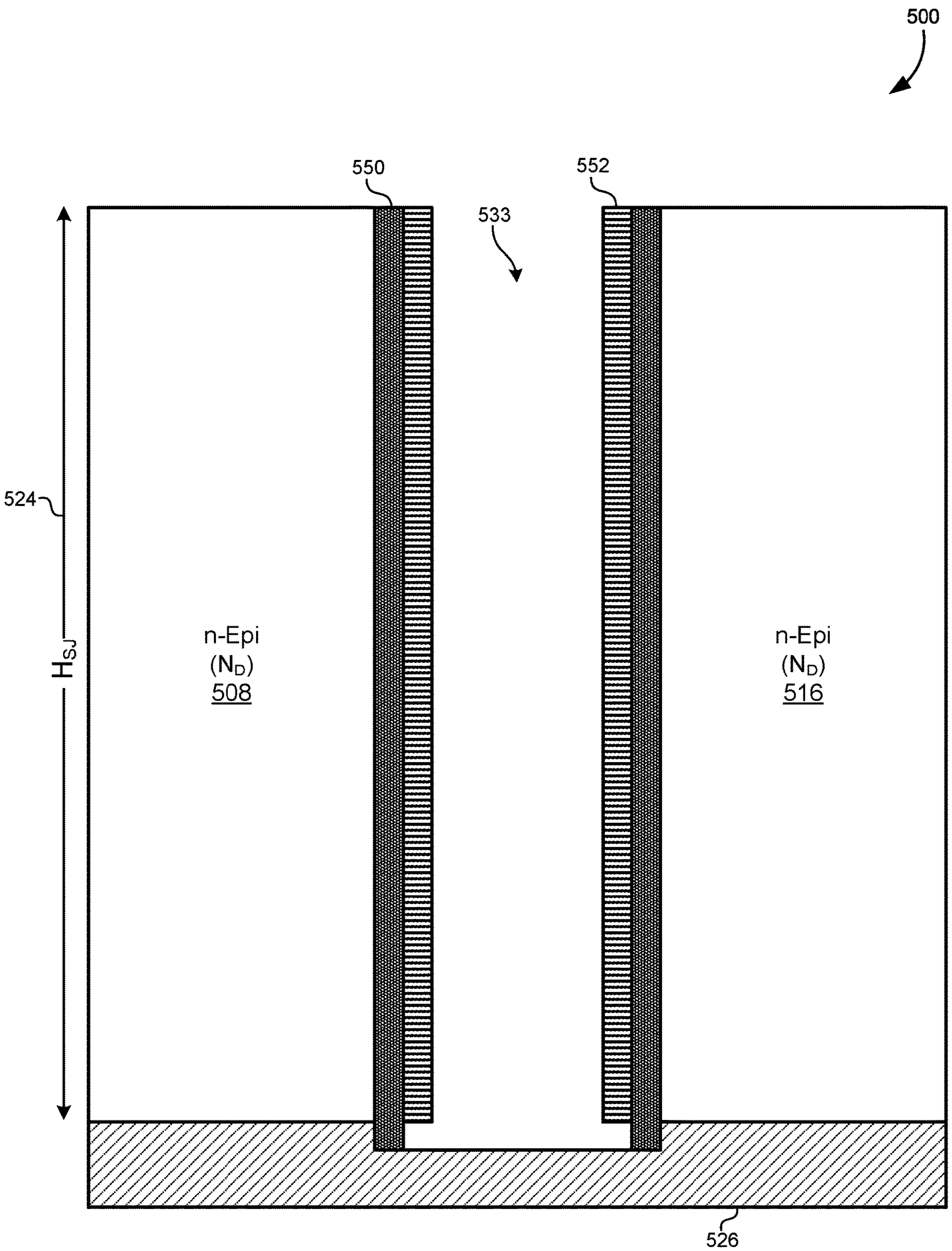

FIG. 5D illustrates the result of a directional etch to remove the P-type liner 550 from the bottom of the trench 533. The portion of the P-type liner 550 that is removed may be located at a bottom of the trench 533. In addition to the portion of the P-type liner 550 that is removed, a portion of the passivation layer 552 may also be removed. The portion of the passivation layer 552 that is removed may be located at a bottom of the trench 533. In some embodiments, removing the portion of the P-type liner 550 may include an anisotropic etching process, such as a reactive-ion etching operation or any other directional dry etch process. For example, the method of flowchart 400 may include applying bias power to etch the bottom of the passivation layer 552 and/or the P-type liner 550. The etching of the passivation layer 552 may be due to a sputtering of the oxide in the passivation layer 552, while a more chemical-based removal may occur through the p-type silicon, or vice versa. The bottom of the passivation layer 552 may be sputtered and removed at a faster rate than the sidewalls of the passivation layer 552 due to the anisotropicity of the etch. Therefore, this operation may remove the P-type liner 550 and the passivation layer 552 from the bottom of the trench 533 while leaving the P-type liner 550 (and the passivation layer 552 along the sidewall portion of the trench 533. This may expose the surface of the substrate 526 at the bottom of the trench 533.

Figure 5E:
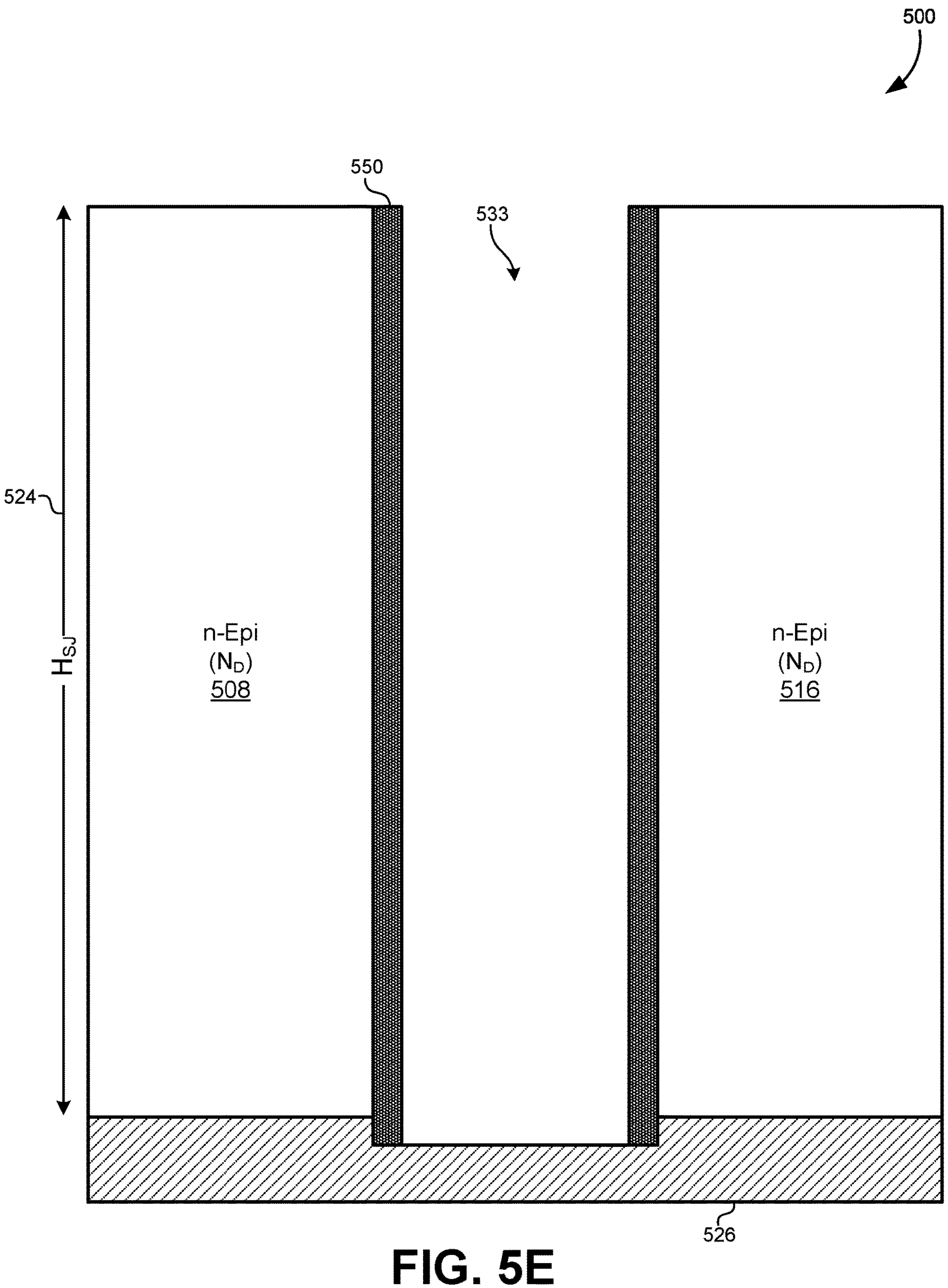

FIG. 5E illustrates the removal of the remaining portion of the passivation layer 552, according to some embodiments. The method of flowchart 400 may optionally include removing the remaining portion of the passivation layer 552. The portion of the passivation layer 552 that is removed may be located along sidewalls of the trench 553 and overlying P-type liner 550. In some embodiments, removing the portion of the passivation layer 552 may include, as one non-limiting example, a wet etching operation using any wet etching reagent(s), such as halogen-containing materials. However, it is contemplated that other forms of etching may alternatively or additionally be utilized including dry etch processes.

The remaining P-type liner 550 may be present on the sidewalls of the trench 553. The P-type liner 550 may be characterized by an aspect ratio of greater than or about 50, greater than or about 100, greater than or about 150, greater than or about 200, greater than or about 250, greater than or about 300, greater than or about 350, greater than or about 400, or more. With taller, narrower features than conventional methods, super junction devices formed using these structures may be characterized by reduced on-resistance due to the separation distances between N-type regions, and may be characterized by increased breakdown voltages due to the depth and uniformity of the P-type pillars formed.

Figure 5F:
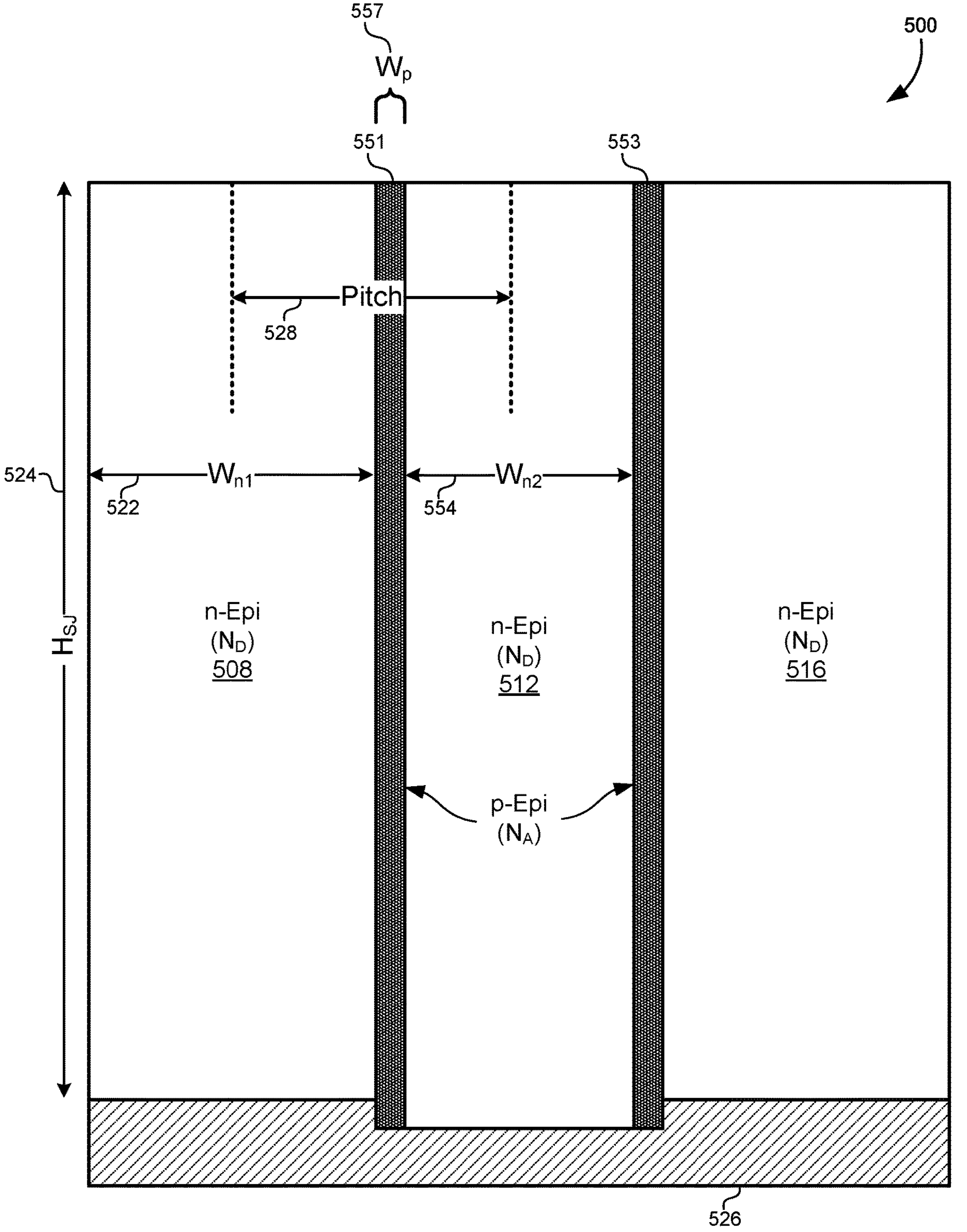

The method of flowchart 400 may include filling the trench 533 with an N-type material to form a second N-type region 512 such that the P-type liner 550 is between the first N-type region 508 and the second N-type region 512 (406). FIG. 5F illustrates the formation of the second N-type region 512, according to some embodiments. The second N-type region 512 may fill the trench 533 by backfilling the internal region of the trench 533 between the sidewalls on which the P-type liner 550 has been formed. The second N-type region 512 may fill the trench 533 free of any voids and without intermittent etching based on the increased width that may be afforded from the initial trench formation (e.g., about 4 μm). The second N-type region 512 may be the same material as the first N-type region 508. Together, the N-type region 508 and the second N-type region 512 may at least partially surround the P-type liner 550. The P-type liner 550 may now be referred to as a P-type region 551 in the super junction device. The trench 533 may be filled with N-type material through an epitaxial growth process. For example, the exposed substrate 526 may provide a base for epitaxially growing N-type silicon material up from the substrate 526 to fill the trench 533.

A ratio of a width of the second N-type region 512 to a width of the P-type region 551 may be greater than or about 15, and may be greater than or about 20, greater than or about 22, greater than or about 24, greater than or about 26, greater than or about 28, greater than or about 30, or more. The ratio between the two materials may lead to a reduction of on-resistance in subsequent devices produced with these structures, as previously discussed. Alternatively stated, a width 557 of the P-type region 551 may be less than or about 10% of a combined width of the P-type region 551 and the second N-type region 512. The width 557 of the P-type region 551 may also be less than or about 9%, less than or about 8%, less than or about 7%, less than or about 6%, less than or about 5%, and so forth, of this combined width. For example, a P-type region 551 with a width 557 of 200 nm may be formed with a second N-type region 512 with a width 554 that is 3.8 μm in a trench that is 4.0 μm wide and 80 μm high.

Figure 5G:
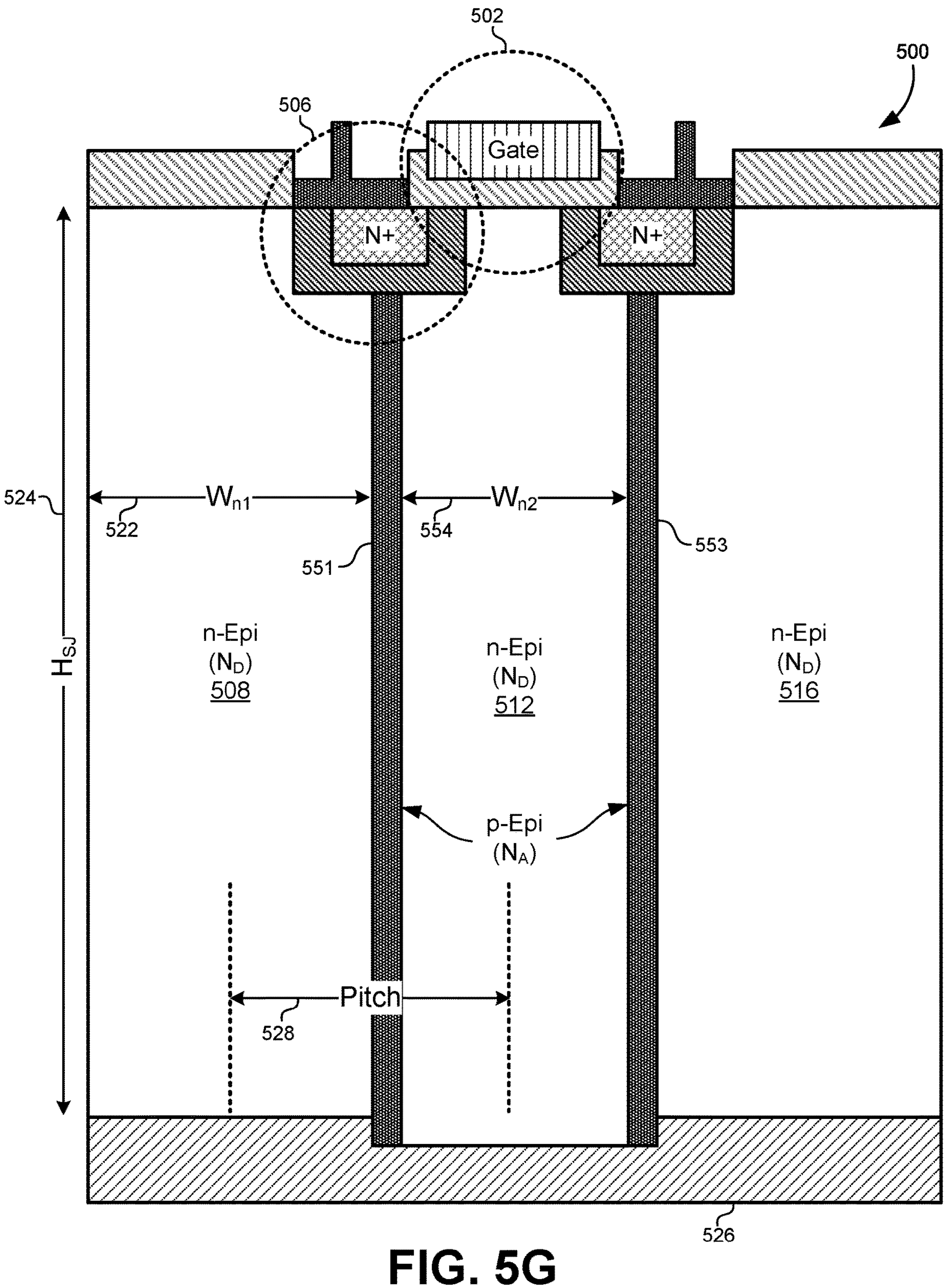

Additional operations may include removing a portion of the N-type material and any remaining mask material by planarizing the structure, such as with a chemical-mechanical polishing operation. The method may also optionally include forming the remaining contact regions for the device 500. FIG. 5G illustrates the device 500 with contact regions, according to some embodiments. The device 500 may include a gate region 502 and/or a source region 506 to complement a drain region formed by the substrate 526. The P-type region 551 may be disposed between the first N-type region 508 and the second N-type region 512 with a much thinner width. To maintain the proper charge balance, the doping level of the P-type region 551 may be increased accordingly. The doping level of the first N-type region 508 and/or the second N-type region 512 may remain the same as for the 650 V device in FIG. 2. For example, the doping level of the first N-type region 508 may be region is between about 1e14 dopants/$cm^3$ and about 1e16 dopants/$cm^3$. The doping level of the P-type region 551 may be greater than or about 8 times, greater than or about 9 times, greater than or about 10 times, and so forth, of the doping level of the first N-type region 508.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a pillar” includes a plurality of such pillars, and reference to “the layer” includes reference to one or more layers and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A super junction device comprising:

a first N-type region extending orthogonally up from a substrate, wherein the substrate forms a first contact region for the device;

a second N-type region extending orthogonally up from the substrate to a second contact region of the device; and a P-type region extending orthogonally up from the substrate to a third contact region of the device, wherein the P-type region is disposed between the first N-type region and the second N-type region, and a width of the P-type region comprises less than or about 10% of a combined width of the P-type region and the second N-type region.

2. The super junction device of claim 1, wherein a height of the P-type region is greater than or about 70 μm.

3. The super junction device of claim 1, wherein the width of the P-type region is less than or about 200 nm.

4. The super junction device of claim 1, wherein:

the first contact region comprises a drain of a super junction transistor;

the second contact region comprises a gate of the super junction transistor; and the third contact region comprises a source of the super junction transistor.

5. The super junction device of claim 4, wherein the super junction transistor has a breakdown voltage of greater than or about 1200 V.

6. The super junction device of claim 1, wherein the combined width of the P-type region and the second N-type region is less than or about 4 μm.

7. The super junction device of claim 1, wherein a doping concentration of the P-type region is higher than a doping concentration of the second N-type region.

8. A super junction device comprising:

a silicon substrate forming a drain region for the device;

a gate region;

a source region;

an N-type region extending from the silicon substrate up to the gate region; and a P-type region extending from the silicon substrate up to the source region, wherein the device has a breakdown voltage of greater than or about 1000 V, and a doping concentration of the P-type region is greater than about 8 times the doping concentration of the N-type region.

9. The super junction device of claim 8, wherein a height of the N-type region is about 80 μm.

10. The super junction device of claim 8, wherein an aspect ratio of an area occupied by the N-type region and the P-type region is less than or about 20.

11. The super junction device of claim 8, wherein a width of an area occupied by the N-type region and the P-type region is less than or about 4 μm.

12. A method of forming a super junction device, the method comprising:

forming a first N-type material on a substrate, wherein the first N-type material has a height of greater than or about 70 μm above the substrate;

etching a trench in the first N-type material, wherein the trench extends from a top surface of the first N-type material down to at least a top surface of the substrate to form a first N-type region;

forming a P-type liner on a sidewall portion of the first N-type region in the trench, wherein the P-type liner is less than or about 300 nm;

filling the trench with an N-type material to form a second N-type region such that the P-type liner is between the first N-type region and the second N-type region.

13. The method of claim 12, wherein the trench is etched below the top surface of the substrate.

14. The method of claim 12, further comprising forming a passivation layer over the P-type liner.

15. The method of claim 14, further comprising removing the passivation layer before filling the trench.

16. The method of claim 12, wherein the P-type liner is also formed on a bottom of the trench.

17. The method of claim 16, further comprising performing a directional etch to remove the P-type liner from the bottom of the trench while leaving the P-type liner along the sidewall portion of the trench.

18. The method of claim 12, wherein a width of the area occupied by the first N-type region and the P-type liner is less than or about 4 μm.

19. The method of claim 12, wherein a doping concentration of the first N-type region is between about 1e14 dopants/$cm^3$ and about 1e16 dopants/$cm^3$.

20. The method of claim 19, wherein a doping concentration of the P-type liner is greater than about 8 times the doping concentration of the first N-type region.

* * * * *